United States Patent [19]

Boys

[11] Patent Number: 4,597,847

[45] Date of Patent: Jul. 1, 1986

[54] NON-MAGNETIC SPUTTERING TARGET

[75] Inventor: Donald R. Boys, Cupertino, Calif.

[73] Assignee: IODEP, Inc., San Jose, Calif.

[21] Appl. No.: 658,738

[22] Filed: Oct. 9, 1984

[51] Int. Cl.⁴ .................................... C23C 15/00
[52] U.S. Cl. ............................ 204/298; 204/192 R
[58] Field of Search .......................... 204/298, 192 R

[56] References Cited

U.S. PATENT DOCUMENTS

| | | | |
|---|---|---|---|
| 3,620,957 | 11/1971 | Crawley et al. | 204/298 |
| 3,669,871 | 6/1972 | Elmgren et al. | 204/298 |
| 3,956,093 | 5/1976 | McLeod | 204/192 |
| 4,060,470 | 11/1977 | Clarke | 204/192 |
| 4,135,286 | 1/1979 | Wright et al. | 29/420 |
| 4,162,954 | 7/1979 | Morrison, Jr. | 204/298 |
| 4,169,031 | 9/1979 | Brors | 204/192 R |
| 4,180,450 | 12/1979 | Morrison, Jr. | 204/298 |
| 4,194,962 | 3/1980 | Chambers et al. | 204/298 |
| 4,198,283 | 4/1980 | Class et al. | 204/298 |
| 4,200,510 | 4/1980 | O'Connell et al. | 204/192 |
| 4,204,936 | 5/1980 | Hartsough | 204/192 |
| 4,209,375 | 6/1980 | Gates et al. | 204/192 |
| 4,219,397 | 8/1980 | Clarke | 204/192 |
| 4,239,611 | 12/1980 | Morrison, Jr. | 204/298 |
| 4,265,729 | 5/1981 | Morrison, Jr. | 204/298 |
| 4,282,083 | 8/1981 | Kertesz et al. | 204/298 |
| 4,299,678 | 11/1981 | Meckel | 204/192 |
| 4,309,266 | 1/1982 | Nakamura et al. | 204/298 |
| 4,312,731 | 1/1982 | Morrison, Jr. | 204/192 |
| 4,324,631 | 4/1982 | Meckel et al. | 204/192 |
| 4,341,816 | 7/1982 | Lauterbach et al. | 427/34 |
| 4,361,472 | 11/1982 | Morrison, Jr. | 204/192 R |
| 4,370,217 | 1/1983 | Funaki | 204/298 |
| 4,389,299 | 6/1983 | Adachi et al. | 204/298 |
| 4,391,697 | 7/1983 | Morrison, Jr. | 204/298 |
| 4,392,939 | 7/1983 | Crombeen et al. | 204/298 |
| 4,401,539 | 8/1983 | Abe | 204/298 |
| 4,401,546 | 8/1983 | Nakamura et al. | 204/298 |
| 4,405,436 | 9/1983 | Kobayashi et al. | 204/298 |
| 4,414,086 | 11/1983 | Lamont, Jr. | 204/192 M |
| 4,417,968 | 11/1983 | McKelvey | 204/192 |
| 4,421,628 | 12/1983 | Quaderer | 204/298 |
| 4,431,505 | 2/1984 | Morrison | 204/298 |
| 4,461,688 | 7/1984 | Morrison | 204/298 |
| 4,466,877 | 8/1984 | McKelvey | 204/298 |

Primary Examiner—Arthur P. Demers
Attorney, Agent, or Firm—Joseph H. Smith

[57] ABSTRACT

A composite sputtering target is provided which is constructed of a non-magnetic sputtering material bonded to a magnetic backing material. A magnetic field is provided through the backing material by a magnetic system, so that the backing material and magnetic system form a closed flux path. During sputtering the magnetic system is operated at a high enough field strength to saturate the backing plate. This saturation causes a fringing field over the non-magnetic target similar to that obtained with magnetic target systems. In another embodiment, the return path for magnetic flux beneath the target material is a permanent part of the magnetic system instead of being permanently attached to the target material as a backing for support.

11 Claims, 9 Drawing Figures

NON-MAGNETIC SPUTTERING TARGET

BACKGROUND OF THE INVENTION

This invention relates to target materials for sputter coating sources in general, and more specifically to specially designed magnetron sources in which a "closed circuit" magnetic path is used to generate a fringing magnetic field over the surface of a non-magnetic target.

Sputtering is a process that falls in the general class of vacuum coating processes. These processes are used to deposit a thin layer of desirable material on the surface or surfaces of another object to provide a particular function or to enhance the appearance of the object. As an example, thin films of aluminum or of aluminum alloys, of the order of one micron in thickness, are applied to silicon wafers in the production of integrated circuits to form the electrical connections between individual semiconductor devices. As another example, thin films of aluminum, chrome, brass, and other metals are applied to the surfaces of plastic objects, such as automotive headlamp bezels, door handles, and door lock plungers to impart to the objects a pleasing metallic appearance.

The sputtering process is a plasma process in which positive ions of an inert gas impinge upon the surface of a target material made up of the material desired for the film. As an example, in a sputtering process of coating a plastic object with chromium, the target material would be the chromium. Sputtering is accomplished from a device called a sputter coating source. Such a source embodies an electrical system for biasing a target material structure with a negative voltage, either DC for electrically conductive targets, or RF for non-conductive targets, so the target will attract positive ions from a plasma of an inert gas that is established in the region of the target. The sputter coating source also contains a system for cooling the target structure and often a magnetic structure for containing and enhancing the plasma.

Positive ions from the plasma are extracted and accelerated to a high kinetic energy to strike the surface of the target structure, where part of the kinetic energy is degraded to heat, and part is imparted by momentum transfer to atoms of the target material. Such atoms that gain sufficient energy to overcome their bonding energy escape from the target surface and are ejected into the vacuum chamber that houses the process. Objects placed in line-of-sight of an operating sputter coating source are coated by the atoms ejected from the target surface.

There are many United States and foreign patents relating to the design and fabrication of both sputter coating sources and sputtering targets for use in such sources. Representative examples include: U.S. Pat. No. 4,166,018, entitled "Sputtering Process and Apparatus", by John S. Chapin; U.S. Pat. No. 4,401,539, "Sputtering Cathode Structure for Sputtering Apparatuses, Method of Controlling Magnetic Flux Generated by Said Sputtering Cathode Structure, and Method of Forming Films by Use of Said sputtering Cathode Structure", by Katsue Abe et al.; and U.S. Pat. No. 4,414,086, "Magnetic Targets for Use in Sputter Coating Apparatus", by Lawrence T. Lamont, Jr.

Sputtering sources known as "diode" sources were the first to be built, and did not use magnetic fields. Commercial application of sputter coating sources has been greatly enhanced by the use of magnetic fields to trap electrons and confine the plasma close to the sputtering target surface, which also enhances the plasma energy and the resulting rate at which the material may be sputtered. U.S. Pat. No. 4,166,018 by John S. Chapin is a typical example of a magnetron sputter coating source. The word "magnetron" source has come to be used by those familiar with the art of sputtering to signify the use of magnetic fields to confine and enhance the plasma in the sputtering process.

This prior art is best understood in the context of simple physical structures that embody the general principles used in the art. By way of illustration, FIG. 1 shows a typical prior art flat (planar) non-magnetic rectangular sputtering target 11 (also called a sputtering cathode) of length "L", width "W", and thickness "T1", with a magnetic field imposed though the target and forming a closed magnetic tunnel. The magnetic field (B-Field) is represented by flux lines 12 and an imaginary plane 13 is shown passing the width of the target. For the purpose of this illustration, the target is assumed to be of non-magnetically permeable material, and therefore transparent to magnetic fields. Similarly, FIG. 2A shows a typical flat disc, non-magnetic, sputtering target 21 with a diameter "D" and thickness "T2", also having a magnetic field imposed through the target to form a closed tunnel. The magnetic field is represented by lines 22 and an imaginary plane 23 is shown bisecting the target through the center of the target disc. FIG. 2B shows a cross-sectional view through the imaginary plane 23 of FIG. 2A and illustrates the spacial relationship between the target and magnet structure 25 used to create the magnetic field through the target. In this case, magnet structure 25 is shown with its poles directly behind the target. Magnetic lines of force 22 extend from one pole to the other of the magnet structure, and, because of the assumption that the target is non-magnetic, the lines of force are not effected by the target material. The magnetic poles are shown to be placed a short distance "x" behind the target, although they could in theory be in contact therewith. The magnets may be either permanent magnets, in which case the strength of the field will be constant, or they may be electromagnets, as illustrated in the figure, by applying voltage "V" to coils 26 to generate a current "I" in the windings. A clear advantage in using electromagnets is the fact that as a target erodes due to the sputtering process, the strength of the magnetic field may be adjusted to maintain a constant plasma impedance. This can be done by adjusting the coil current "I" by changing the applied coil voltage "V". In this illustration of magnetron source principles, some of the required characteristics to form and maintain a plasma are not shown, such as an applied negative voltage on the target, and a vacuum enclosure for the process.

As illustrated in FIG. 2B, the magnetic field lines 22 are more concentrated at the inner poles (S) than at the outer poles (N). This polarity is a matter of convention and the situation would be the same if the inner poles were (N) and the outer poles were (S). There is also a skewing of the field toward the outer poles, the reason for which will become apparent shortly.

FIG. 2C, a top view of the disc-shaped cathode of FIGS. 2A and 2B, shows that the inner pole structure, indicated by shaded area 4, is much smaller in area than the outer pole structure, indicated by the shaded area 3. Hence, the magnetic field created between the poles will have greater density (more field lines per unit area) at the smaller area inner pole than at the larger area outer pole. This effect of unequal areas causes skewing of the magnetic lines of force to the outside of the disc as shown schemmatically in FIG. 2B. This skewing of the B-Field will cause asymmetrical erosion of the target surface illustrated by dotted lines 27 and 28 in FIG. 2B. Similar effects are seen at the ends of the rectangular planar target illustrated in FIG. 1, and in other configurations where the magnetic structure is curved. This skewed, lower density, magnetic field to the outside can cause erosion of support and clamping structures and overheating of ground shielding that may be positioned around the target. It can also provide a relatively easy escape path for electrons to the ground shielding, anodes, or the chamber structure, thereby lowering the plasma impedance and, in turn, the operating voltage, and can result in other operating problems as well. In such cases, the plasma will not be well confined around the outside of the magnetron sputter coating source, an effect commonly called "blooming". Another, detrimental phenomemon, the magnetic mirror effect, makes the blooming of the plasma to the outside even more pronounced due to the unequal areas of the pole structures of curved sources.

To appreciate the significance of the above described problems, it is best to first discuss some of the basic physics of the sputtering process, which can be understood by referring to FIG. 2D. Target 21 is shown connected to a power supply 29 at the negative terminal so that the target is biased at a negative electrical potential relative to the surrounding structures. The positive terminal of power supply 29 is connected to earth ground, as are the walls (not shown) of the vacuum enclosure and possibly other structures, often called anodes, surrounding the target. This power supply causes an electrical force field, hereinafter the E-Field, to be established between the target surface and surrounding structures, represented in FIG. 2D by lines of force E. The arrangement of components in a magnetron sputter coating source is such that the E-Field is generally perpendicular to the B-Field.

Before a magnetron sputter coating souce is ignited, most of the air is pumped away from the target enclosure. Next, an inert gas such as argon is introduced at low pressure ($\sim 10^{-2}$ Torr) into the enclosure surrounding the sputter coating source. This gas is represented by a single neutral argon atom 30, although there will actually be very many neutral argon atoms in the enclosure.

When the power supply 29 is turned on, an electrical potential is established from the target surface to the chamber walls and/or anodes corresponding to the E-Field, E, and electrons are emitted from the target surface. In the absence of an electrically conductive medium, relatively few electrons will be emitted, and only a very small electrical current will flow between the target surface and the chamber walls and/or anode structures. An electron 2, traveling in the presence of a magnetic field will tend to be "captured" and will follow a spiral path around a line of magnetic force, such as line B. If the electron has an initial velocity, V, which has a component along the line of magnetic force, the electron will travel along the line until it is repelled from the target surface by the electric field indicated by vectors E8 and E9 (since both the target surface and the electron have negative electrical charge, and like charges repel). Therefore, electrons emitted from the target surface will not return to the surface, but the effect of the magnetic field will be to retain such electrons near the surface. As a result of this repulsion, however, the electrons do tend to transfer to magnetic field lines which extend farther from the target surface as the electrons execute their spiral path, and hence they eventually wander away from the immediate surface of the target.

Another force acting on electron 2 is a result of the crossed B-Field and E-Field. In the presence of crossed fields, the electron is acted upon by a force perpendicular to both the E-Field and the B-Field, tending to impart to the electron a "drift" velocity in the direction of the vector "D" in FIG. 2D. This drift velocity tends to carry the electron along the direction of the magnetic tunnel illustrated in FIG. 2A. The net result then of the repulsion and the crossed E-Field and B-Field is that the electron will tend to travel gradually away from the target surface, while at the same time drifting along the direction of the tunnel. For this reason, the magnetic tunnels are typically designed to close on themselves, in order that the electrons will not be lost from the vicinity of the target surface due to this drift effect.

The magnetic mirror effect can be explained by referring to FIG. 2E, which shows a portion of the cross-section through plane 23 of the round planar magnetron target 21 of FIG. 2A. The B-Field pattern is illustrated by lines of force B1 through B5, which again are shown as skewed due to the unequal areas of the pole pieces 25N and 25S. This skewing of the field results in the lines of force converging toward the inner pole pieces and diverging toward the outside and away from the outer pole pieces. This converging of the magnetic field at the inner pole pieces means that the field strength increases there, since there are more lines per unit area in that region. Because of this increase in field strength, as an electron travels along a line of force, it spirals in an ever tighter orbit, converting more and more translational energy into energy of rotation, until finally the velocity along the field line vanishes. Then the electron turns around, still spiraling in the same direction, and moves backward substantially from whence it came. In a sense, it has been reflected, and hence the name the magnetic mirror effect. This effect can be thought of as a force field, represented by vectors F1 through F5, which tend to push electrons along the lines of force away from the area of convergence of the field lines.

The net effect of these forces, that of repulsion from the target surface, the magnetic mirror effect due to the converging magnetic field, and the drift force due to the crossed magnetic fields, is to cause electrons to drift around the magnetic tunnel, but also to be forced upward and away from the center of curvature of the magnetic structure into the area to the outside where there is lesser field intensity. These same effects occur at the ends of a rectangular planar magnetron and for other curved magnetic structures.

These forces have important implications for the sputtering process, for it is the electrons trapped near the surface of the target that drive the process. The trapped electrons collide with neutral argon atoms 30, and in a percentage of such collisions an electron is stripped from the argon atom, adding to the electron population and creating positively charged argon ions 9. Ions thus created are strongly attracted to the target surface because of the negative electrical potential maintained on the target. As these ions impact the target surface, some of the kinetic energy is converted to heat, and in a certain percentage of these collisons, neutral atoms of the target material (represented by metal atom 8 in FIG. 2D) gain sufficient energy by momentum transfer to escape from the target surface and are ejected into the process volume. Such neutral target atoms are not effected by the electrical and magnetic fields, and impact any object surface in line-of-sight of the target surface, creating a coating of the target material on the object surface.

The desired effect, then, is to trap electrons as efficiently as possible to cause efficient ionization of the inert gas. The blooming effect to the outside of curved planar sources, away from the center of curvature, is detrimental because it allows electrons to escape more easily to the outside, and can result in overheating and erosion damage to surrounding structures.

In all of the background discussed thus far, the assumption has been made that the target material is non-magnetically permeable, such as aluminum or chromium, and the targets are therefore transparent to magnetic fields. However, magnetic targets are an important element of the art. FIG. 3 shows a cross-section of a prior art, disc-shaped, planar target similar to FIG. 2A, except that the target material is now assumed to be magnetically permeable, and the poles of the magnet structure are in contact with the back of the target. In this case, there are considerable differences in the way the magnetic circuit operates to create the necessary magnetic tunnel on the target surface.

In the non-magnetic case, poles of opposite polarity are created at the ends of the magnet structure 25 in FIG. 2B and a magnetic field is established with lines of force extending from these poles, labeled N and S. With a magnetic target, as shown in FIG. 3, the magnetic flux, indicated by flux lines 7, will tend to pass through the magnetic target radially and return to the opposite pole of the magnet structure, so that a "closed" magnetic circuit is created. If the entire closed path is of sufficient cross-sectional area and relatively low values of magnetomotive force are applied, most of the magnetic flux created will be confined to the target and the magnet structure, and there will be very little fringing field. As the magnetomotive force is increased, however, a point will be reached where some portion of the path becomes magnetically saturated, i.e., the value of flux (lines of force) per unit area is reached above which the internal flux density cannot increase. Additional flux created by increasing the magnetomotive force can only be accomodated in the circuit by fringing into the volume surrounding the saturated portion, in effect by-passing the region of saturation.

By design in such an arrangement, the magnet structure is made of sufficient cross-section that saturation will take place in the target material before it occurs in the magnet structure. For disc-shaped targets, this saturation occurs very near the inner pole, because this is the point in the flux path in the target of the least cross-sectional area. In FIG. 3 this region of saturation is shown at 38, at a radius "r" from the center of curvature, just to the outside of the contact area of the inner pole of the magnet structure 33. Essentially, the portion 39 of the magnetic target to the inside (toward the center of curvature), of the radius of saturation becomes an extension of the inner pole, and the portion 37 of the magnetic target to the outside of the radius of saturation becomes an extension of the outer pole of the magnet structure. The magnetic poles are now immediately adjacent to one another on the target surface instead of at the ends of the magnet structure 33, and the fringing field 32 created is across an apparently much smaller gap than is the case for the non-magnetic target illustrated in FIG. 2B.

There are two quite beneficial effects in this latter arrangement. One is that the smaller gap requires less magnetomotive force to create a sufficient fringing field (magnetic tunnel) for the operation of a magnetron sputter coating source. The other is that the effect of the outer magnetic pole, which places the outer pole very near the inner pole, separated only by the region of saturation, serves to confine the magnetic field more effectively than is the case with non-magnetic targets. Hence, the "blooming" effect of the plasma is greatly reduced. The outer periphery of the magnetic field is nearly as dense as the field near the region of saturation, and the magnetic mirror effect is not so evident. As a result, electron escape to the outside is reduced, and the position and control of the magnetic tunnel and the operating characteristics of the source are improved.

Given the dramatic improvements evident in magnetic target systems, what is needed is a magnetic enhancement system for non-magnetic target structures which is as effective as magnetic target systems in containing electrons near the target surface and in maintaining position and control over the magnetic tunnel.

SUMMARY OF THE INVENTION

In accordance with a preferred embodiment of the invention, a composite sputtering target is provided which is constructed of a non-magnetic sputtering material bonded to a magnetic backing material. A magnetic field is provided through the backing material by a magnetic system, so that the backing material and magnetic system form a closed flux path. During sputtering, however, the magnetic system is operated at a high enough field strength to saturate the backing plate. This saturation causes a fringing field over the non-magnetic target similar to that obtained with magnetic target systems. The magnetic system below the backing plate is arranged so that the fringing field creates a closed magnetic tunnel over the non-magnetic sputtering material, in order to provide the desired magnetic enhancement.

In another embodiment, the return path for magnetic flux beneath the target material is a permanent part of the magnetic system instead of being permanently attached to the target material as a backing for support.

DETAILED DESCRIPTION OF THE INVENTION

Figure 1:
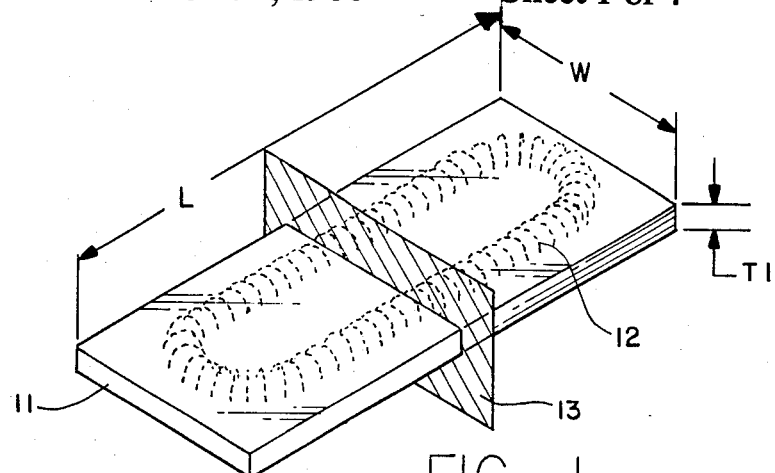
FIG. 1 shows a typical prior art target used in a rectangular planar magnetron sputtering source.
Figure 2A:
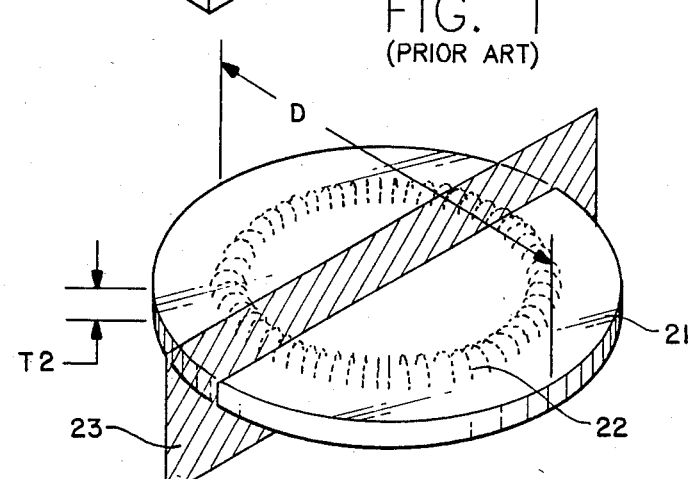
FIG. 2A shows a oblique view of a typical prior art target used in a circular planar magnetron.
Figure 2B:
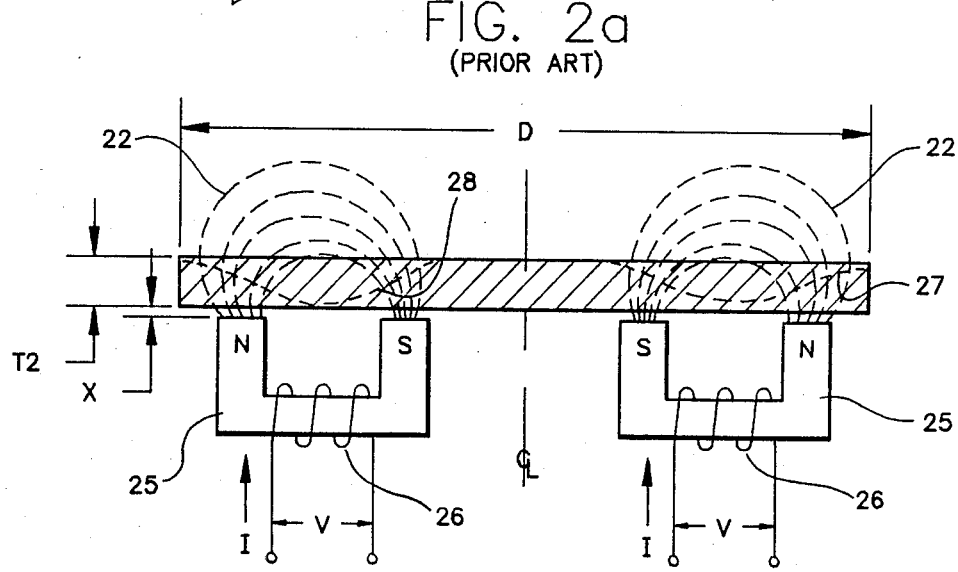
FIG. 2B is a side view of the target structure of FIG. 2A as it is used in a magnetron sputtering source.
Figure 2C:
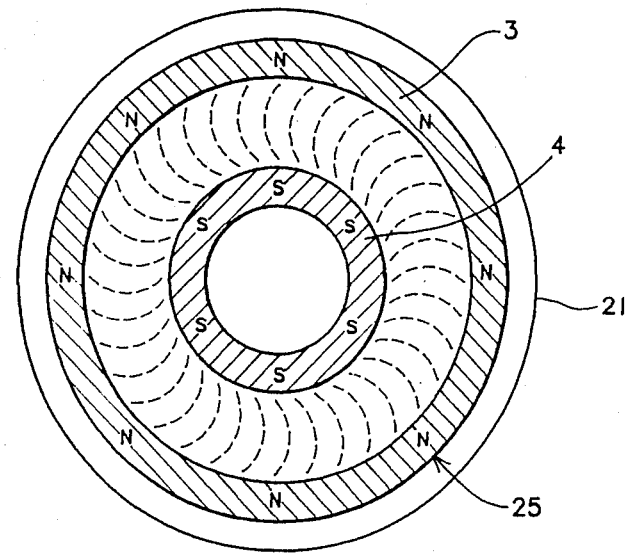
FIG. 2C shows a top view of the target of FIG. 2B illustrating the relative position of the magnetic structure used to supply a magnetic field over the target.
Figure 2D:
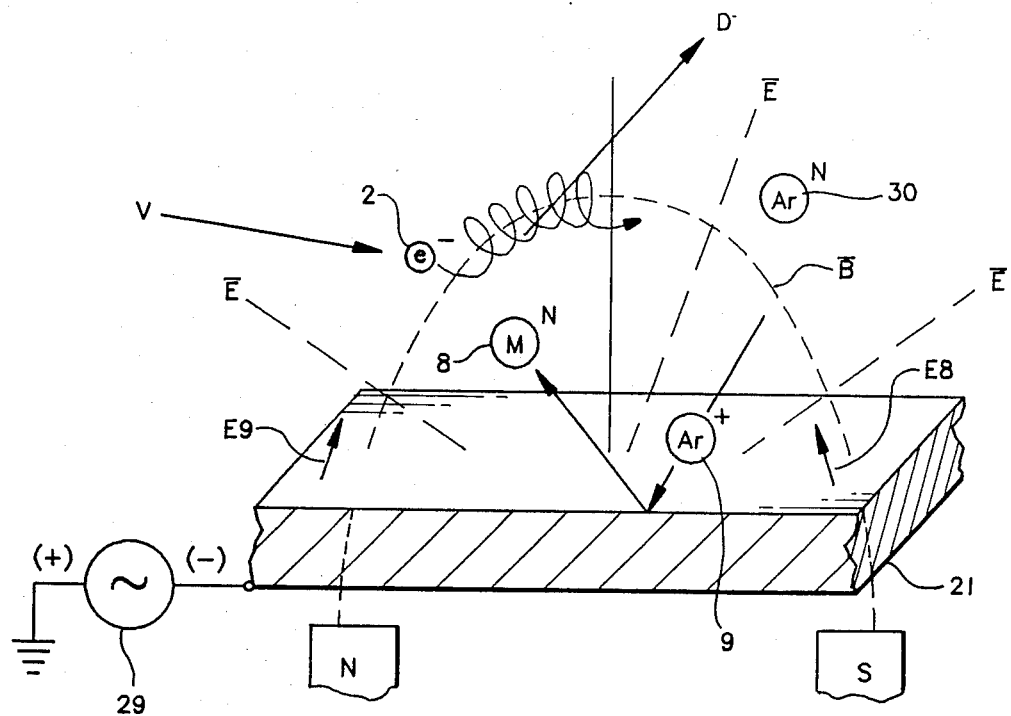
FIG. 2D shows a portion of the target structure illustrated in FIGS. 2A, 2B and 2C demonstrating the relationship of the electric and magnetic fields, and their effects on electrons and ions in the vicinity of the target surface.
Figure 2E:
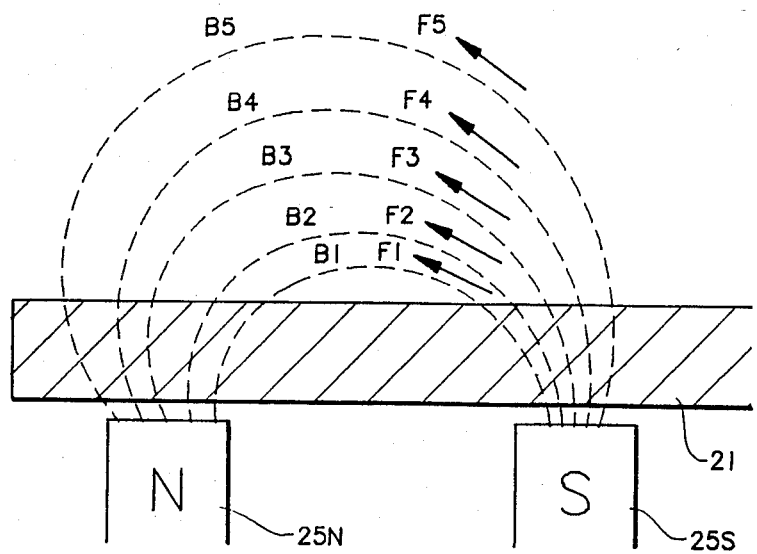
FIG. 2E shows an expanded view of the typical magnetic field lines experienced using the magnetron system shown in FIGS. 2B and 2C which result in the magnetic mirror effect.
Figure 3:
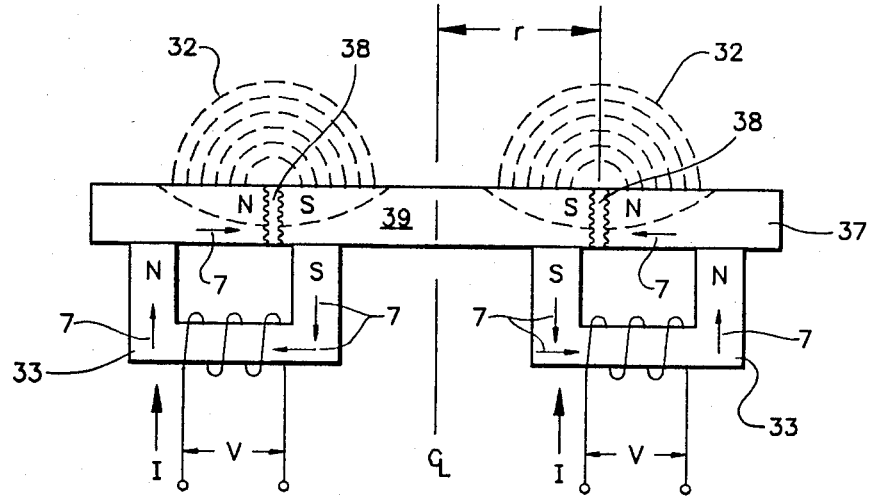
FIG. 3 shows a typical prior art circular planar magnetron sputtering device used with a magnetic target structure.
Figure 4A:
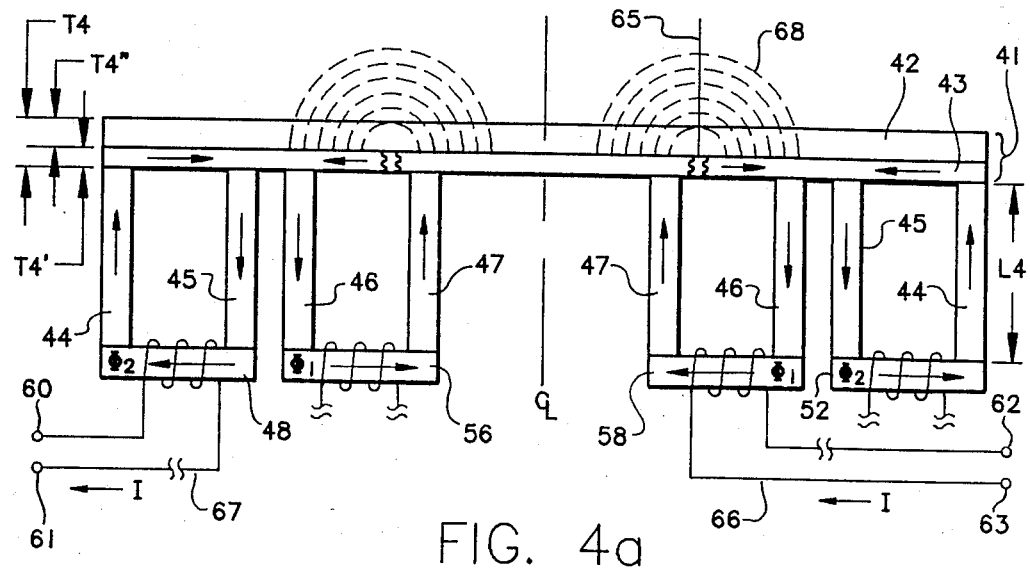
FIG. 4A is a cross-sectional view of a circular magnetron sputtering source and non-magnetic target structure according to the invention.
Figure 4B:
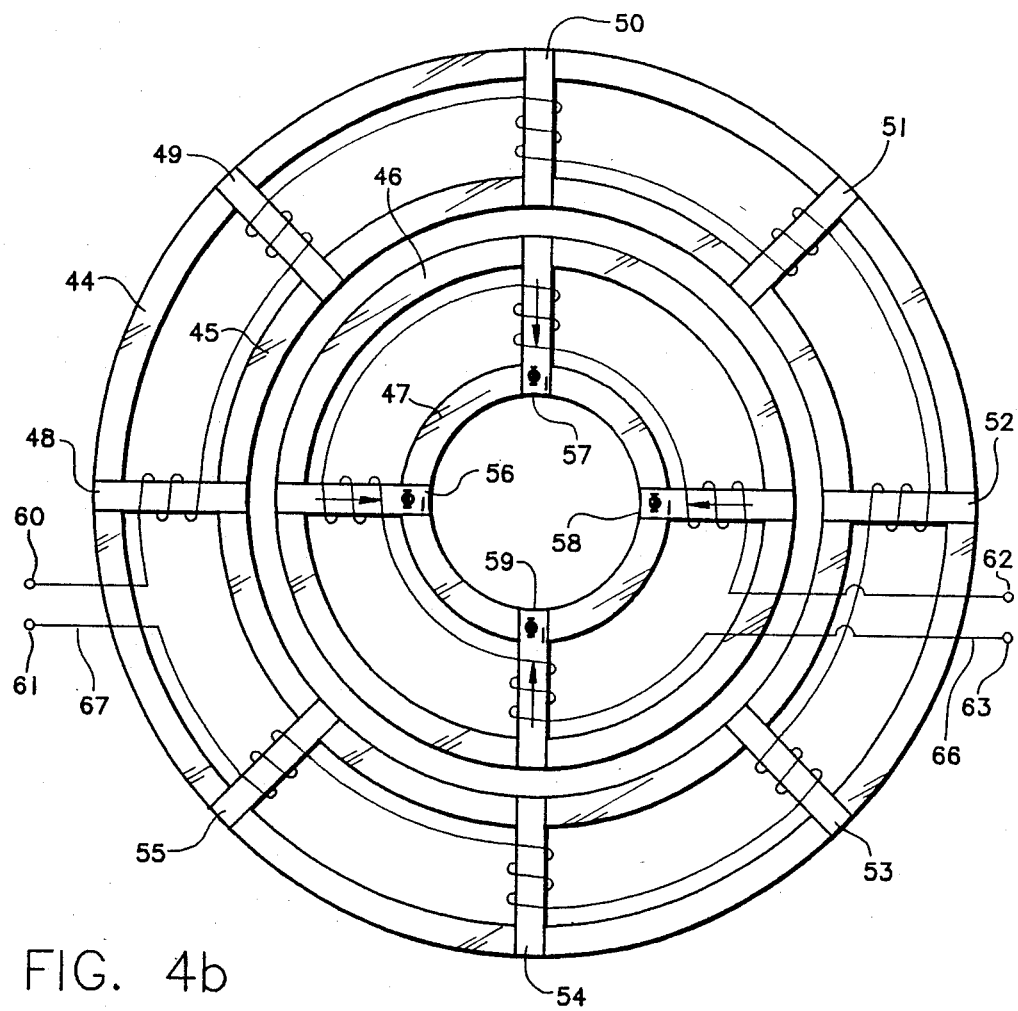
FIG. 4B is a bottom view of the structure illustrated in FIG. 4A.

Shown in FIGS. 4A and 4B is an improved magnetron composite sputtering target structure 41 according to the invention for the sputtering of non-magnetic materials. The target structure includes a non-magnetic target material 42 bonded to a backing plate 43 of magnetic material. Bonding techniques for attaching the backing plate to the target material include, for example, solder bonding, and adhesive bonding. Target material 42 can generally be any non-magnetic material that it may be desirable to sputter, and in this embodiment is chosen to be chromium having a thickness T4" of about 0.25 inches. Backing plate 43 is preferrably of a material with ferromagnetic permeability, such as iron, low carbon steel, or 400 series stainless steel, but may also be of materials with somewhat lesser permeability. For a circular target 41 of about 10 inches in diameter, target thickness T4, i.e., backing plate and target material together, typically ranges from about 0.375 inches to about 0.75 inches. The typical thickness T4' for the backing plate itself ranges from about 0.125 inches to about 0.2 inches, and in this particular embodiment the backing plate is chosen to be constructed of low carbon steel approximately 0.125 inches thick.

This target structure 41 is placed in intimate contact with four concentric cylinders which form magnetic pole pieces 44, 45, 46, and 47, typically by means of screw fasteners or clamps. In this embodiment, the following dimensions are chosen for the cylinders: wall thickness is 0.25 inches, the length L4 of each cylinder is approximately 1.5 inches, the outside diameters of cylinders 44, 45, 46 and 47 are 10 inches, 7.5 inches, 6.5 inches and 4 inches, respectively. Four cores, 56, 57, 58, and 59 of ferromagnetic material are fastened to the two inner cylinders 46 and 47 opposite the target structure to form a magnetic bridge therebetween. Similarly, eight cores, 48 through 55, of ferromagnetic material bridge the two outer cylinders 44 and 45. The four cores, 56 through 59, are equally spaced at 90° and the eight cores, 48 through 55, are equally spaced at 45°, these equal spacings to insure relatively equal magnetic fields at symmetric locations above the target surface. Each core is typically square in cross-section, about 0.75 inches on a side.

Electrical power to drive the field for this electromagnet structure is provided by an external voltage (not shown) across electrical terminals 60 and 61, and 62 and 63. Typically insulated copper wire is used to wrap each core in series as illustrated in FIG. 4B for each independent pair of cylinders, i.e., for the outer pair of cylinders 44 and 45, starting at terminal 60, several turns are taken around core 48, then the same number of turns in the same direction around 49, then the same number in the same direction around 50, and so forth to and including core 55, and finally to terminal 61, and similarly for the inner pair of cylinders 46 and 47. Additionally, these core windings are typically made over insulating material, such as aluminum oxide or teflon, to further insure electrical isolation between the magnet structure and the power supply to drive the sputtering process.

As alluded to earlier, this arrangement creates two closed independent magnetic circuits, one corresponding to cylinders 46 and 47, together with cores 56 through 59, and the portion of backing plate 43 between cylinders 46 and 47, and another corresponding to cylinders 44 and 45, together with cores 48 through 55 and the portion of the backing plate 43 between cylinders 44 and 45. More specifically, when a current $I_1$ flow in wire 66, that same current will flow throughout the wire and each of cores 56 through 59 will contribute an equal value of magnetomotive force, $N_1I_1$, (sometimes called the magnetomotance) where $N_1$ is the number of turns on each core and $I_1$ is measured in amperes. Since there are four cores in this particular magnetic circuit, the total magnetomotive force is $4N_1I_1$, since each core is wound in the same direction. This magnetomotive force creates a flux $\Phi_1$ in each of cores 56 through 59 which is directed radially inward as illustrated, depending on winding direction.

This flux will then change directions as it traverses a closed path around the circuit. It will be directed vertically upward in cylinder 47, radially outward in the portion of the ferromagnetic backing plate between cylinders 46 and 47, vertically downward in cylinder 46, and will return to the cores to complete a closed path. The flux path is thus toroidal in nature, and more importantly is directed radially outward and is evenly distributed in the ferromagnetic backing plate. Similarly, if a current $I_2$ is induced in wire 67, a magnetomotive force of $8 N_2I_2$ will be generated in the outer magnetic circuit and a corresponding toroidal flux will be generated which is directed radially inward and evenly distributed in the backing plate.

During the sputtering process, this system is operated above the saturation point of the magnetic backing plate. For example, as the current $I_1$ is increased, the magnetic flux $\Phi_1$, eventually increases to the saturation limit of the low carbon steel used in this embodiment (typically at about $2.4 \times 10^4$ gauss). Up to that point, as the current increases, the flux increases smoothly and monotonically. However, when the point in the magnetic circuit with the least cross-section reaches saturation, the rate of change of flux in the magnetic materials with respect to changes in magnetomotance becomes discontinuous. Further increases in the magnetomotance then result in fringing of the magnetic field out of the magnetic backing plate 43 as illustrated by flux lines 68 at the saturation radius 65 which is near the outer radius of the inner pole cylinder 47. This fringing field then penetrates the non-magnetic sputtering material 42 and forms the closed tunnel desired to trap electrons near the surface of the target as is characteristic of operation of the source in the magnetically enhanced mode. A typical field strength to achieve such enhancement is about 200 gauss parallel to the target surface at a point 0.5 inches above the surface. In this configuration, all the benefits of the magnetic target systems of the prior art can be achieved for systems using non-magnetic target materials.

The following calculations with regard to saturation limits are provided as a model to illustrate the more general design principles involved in the development of this embodiment, and so that systems having other dimensions can be easily developed. Generally, Ohm's Law for magnetic circuits (in c.g.s. units) is given by:

$$\Phi = \frac{0.4 \pi NI}{\sum_i R_i}$$

where $\Phi$ is the total flux in the circuit (in maxwells), NI is the total magnetomotance applied (in ampere-turns), and $R_i$ is the magnetic reluctance of the i-th element in circuit. The reluctance, $$R_i = \frac{L_i}{A_i \cdot \mu_i}$$

where $L_i$ is the length of the i-th element, $A_i$ is its cross-sectional area, and i is its relative magnetic permeability, all in c.g.s. units. For the inner magnetic circuit involving cylinders 46 and 47, the total reluctance, $\Sigma R_i$, is made up of the reluctances from the four cores, the two cylinders, and the backing plate material. Also, assuming all of these elements are constructed of low carbon cast steel, the relative permeability at the flux densities expected to be used is approximately 1000. Substituting the various dimensions for each element and the above value for magnetic permeability into Ohm's Law, yields $\Phi = 1.56 \times 10^3$ NI maxwells. Hence, the combined flux in the closed path will be related to the magnetomotance generated by the cores by the factor $1.56 \times 10^3$. (See Appendix A for details of the calculation.)

As indicated earlier, saturation occurs at about $2 \times 10^4$ gauss, and at the point of least cross-sectional area in the circuit. This occurs at radius 25 which is near the outer radius of the inner pole cylinder 47. If the cross-sectional area of the inner pole cylinder is A, then the total saturation flux through that area will be $(2.4 \times 10^4 \text{ gauss}) \times A$. For this particular embodiment, the thickness of the backing plate is 0.125 inches and the radius of the cylinder is 2 inches, so that the cross-sectional area is $2\pi(2 \text{ in})(0.125 \text{ in}) = 1.571 \text{ in}^2$ or 10.13 cm$^2$. Hence, the saturation flux will be $(2.4 \times 10^4 \text{ gauss}) \times (10.13 \text{ cm}^2) = 2.4 \times 10^5$ maxwells. From the previous Ohm's Law calculation, $\Phi = 1.56 \times 10^3$ NI, so that $$NI = \frac{\Phi}{1.56 \times 10^3} = \frac{2.4 \times 10^5}{1.56 \times 10^3} = 156 \text{ ampere-turns}$$

Hence, if for example 6 turns are taken on each core, for a total of 24 turns, a current in wire 66 of 6.5 amperes will provide the minimum 156 ampere-turns required for saturation.

Those skilled in the art will appreciate that the above values are at best approximate, since there will be fringing (and loss) at the corners, variations in magnetic permeability with field strength, and other discrepancies. Due to these effects, it is customary to enhance the field strength, either by increasing the current or the number of turns to counterbalance these losses. For example, in a typical situation, with four cores, it would not be uncommon to use up to 12 turns each, for a total of N=48 turns. Similarly, the wire size is chosen so that the current required is easily obtained with standard power supplies. For example, a wire size can be chosen to provide a resistance for the total length of wire used so that the four cores in series can be driven with a standard 10 volt, 10 amp, DC power supply at 1 amp per volt (R=1 ohm). Then 10 volts applied across terminals 62 and 63 would provide 10 amps in wire 66 and a magnetomotance of 480 ampere-turns, an adequate surplus over the calculated saturation value of 156 ampere-turns to ensure a usable fringing field.

Just as the above analysis was performed for the inner magnetic circuit, a similar calculation can be performed for the outer circuit. Such a calculation to obtain a theoretical value for saturation of the backing plate 43 at the saturation radius 24 yields a value of 133 ampere-turns.

Although it may seem surprising that a lower value of the number of ampere-turns is required to saturate at a larger diameter, this is a direct result of the larger pole cross-sectional areas and the larger number of cores providing a lower reluctance. It will be true, however, that after saturation, the effective reluctance caused by the saturation region, will be larger than for the inner pole structure, and beyond saturation larger values of NI will be required to provide an adequate fringing field for the outer circuit than for the inner circuit. A typical number of turns for each coil is still about 12 turns, providing N=96 and NI=960 ampere-turns for a 10 ampere current. Again, the wire size would be chosen to provide a total resistance of about 10 ohms for all of the 8 coils in series. Also, with respect to this outer circuit, it should be understood that the flux direction in the toroid should be opposite that of the inner circuit, so that the polarity of the magnetic field in cylinders 45 and 46 be in the same direction, so as not to short circuit the flux path.

Another embodiment of the invention may also be illustrated with reference to FIGS. 4A and 4B. In this embodiment, magnetic plate 43 which provides the return paths for flux beneath the target material 42 is a permanent part of the magnet structure, instead of being attached permanently to the target material as a backing plate. Hence, plate 43 becomes part of the sputter coating source. In this embodiment, there is, of course, no bond to the target material at the interface between the target material 42 and the plate 43. Instead, the target is supplied to the source as a one-piece non-magnetic target material and is joined to plate 43 of the source by clamping or by other suitable fastening means. The design principles and fundamentals of operation in this embodiment are essentially the same as for the previous one.

While there has been shown and described the preferred embodiment of the present invention, it will be apparent to those skilled in the art that many changes and modifications may be made without departing from the invention in its broader aspects. For example, only one magnetic tunnel may be desired over the surface of the non-magnetic target material, or perhaps more than two tunnels may be desired. Also, each of the polarities may be reversed from those shown in the figures. In addition, the teachings of this invention apply to other geometries than a disc geometry and, for example, include rectangular and conical structures. Also, it will be apparent to those skilled in the art that the circular region in the middle of target 41, out to the inside diameter of cylinder 47 is superfluous material and may be discarded. Therefore, the appended claims are intended to cover all such modifications and changes that fall within the true spirit and scope of the invention.

What is claimed is:

1. A composite sputtering target structure used in a magnetron sputtering device having a plurality of magnetic pole faces, comprising:

a non-magnetic sputtering material; and a magnetic backing plate bonded to said non-magnetic sputtering material, said magnetic backing plate configured to be placed in contact with said plurality of magnetic pole faces to form a magnetic shunt between said pole faces.

2. An apparatus for sputtering non-magnetic sputtering material, comprising:

a composite sputtering target having a non-magnetic sputtering material bonded to a magnetic backing plate; and magnetic means having a plurality of pole faces in contact with said magnetic backing plate for causing magnetic saturation in said magnetic backing plate and for creating a fringing magnetic field over said non-magnetic sputtering material by said magnetic saturation;

said magnetic backing plate acting as a magnetic shunt between said pole faces with each pole face in contact with said magnetic backing plate.

3. An apparatus as in claim 2 wherein said fringing magnetic field creates a closed magnetic tunnel over said non-magnetic sputtering material.

4. An apparatus as in claim 2 wherein said fringing magnetic field creates a plurality of closed magnetic tunnels over said non-magnetic sputtering material.

5. An apparatus as in claim 4 wherein said magnetic means comprises a plurality of magnetic pole pieces in contact with said magnetic backing plate, each pole piece having at least a pair of said pole faces.

6. An apparatus as in claim 5 wherein the locus of points defined by the points of contact of the pole pieces to the backing plate forms a plurality of closed loops.

7. An apparatus used in sputtering, comprising:

a non-magnetic sputtering material;

a magnetic backing plate bonded to said non-magnetic sputtering material; and magnetic means having a plurality of magnetic pole pieces in contact with said backing plate for causing magnetic saturation in said magnetic backing plate and for creating a fringing magnetic field over said non-magnetic sputtering material by said magnetic saturation, said fringing field creating a plurality of closed magnetic tunnels over said non-magnetic sputtering material;

said plurality of pole pieces forming a plurality of concentric cylinders, such that a locus of points defined by the points of contact of the pole pieces to the backing plate forms a plurality of closed loops.

8. An apparatus as in claim 7 wherein said magnetic means further comprises field means for creating a magnetic field in said pole pieces.

9. An apparatus as in claim 8 wherein said field means comprises an electromagnet.

10. A magnetron source for sputtering a non-magnetic target material, comprising:

saturation means constructed of a magnetic material having a magnetic flux density saturation value M greater than zero, for creating a fringing magnetic field over said non-magnetic target material; and magnetic means for creating a magnetic flux density in said magnetic material and for saturating said magnetic material to create said fringing magnetic field;

said saturation means and said magnetic means together forming a closed magnetic flux path contained by said magnetic means and said saturation means when said saturation means carries a magnetic flux density having a magnitude less than M, such that there is a fringing magnetic field over said non-magnetic target material only when said saturation means carries a magnetic flux density having a magnitude equal to M and there is no fringing magnetic field when said magnitude is less than M.

11. A magnetron source as in claim 10 wherein said fringing magnetic field creates a closed magnetic tunnel over said non-magnetic sputtering material.

* * * * *